(12) United States Patent
Mutnury et al.

(10) Patent No.: US 12,406,781 B2
(45) Date of Patent: Sep. 2, 2025

(54) LOSS-CONTROLLED COMPUTING CABLE

(71) Applicant: Dell Products L.P., Round Rock, TX (US)

(72) Inventors: Bhyrav M. Mutnury, Austin, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 761 days.

(21) Appl. No.: 17/660,754

(22) Filed: Apr. 26, 2022

(65) Prior Publication Data

US 2023/0344174 A1  Oct. 26, 2023

(51) Int. Cl.
  *H01P 1/22*  (2006.01)
  *H01B 11/00*  (2006.01)
  *H04L 25/02*  (2006.01)

(52) U.S. Cl.
  CPC .......... *H01B 11/00* (2013.01); *H01B 11/005* (2013.01); *H01P 1/22* (2013.01); *H01P 1/227* (2013.01); *H04L 25/0272* (2013.01)

(58) Field of Classification Search
  CPC . H01P 1/227; H01P 1/22; H01P 1/225; H01B 11/00; H01B 11/12; H01B 7/0054
  USPC .............................................. 333/81 A, 81 R
  See application file for complete search history.

(56) References Cited

U.S. PATENT DOCUMENTS

| | | | |
|---|---|---|---|
| 5,525,953 A * | 6/1996 | Okada .................. | H01P 1/2039 333/204 |
| 2011/0285482 A1* | 11/2011 | Terakawa .............. | H03H 7/427 333/81 R |
| 2020/0035901 A1* | 1/2020 | Olivadese ............ | H01P 11/003 |

\* cited by examiner

*Primary Examiner* — Stephen E. Jones
(74) *Attorney, Agent, or Firm* — McDermott Will & Schulte LLP

(57) ABSTRACT

A computing cable that connects computing elements, including: a trace including a first trace segment and a second trace segment, the trace having a first impedance; and an attenuator connecting the first trace segment to the second trace segment, the attenuator including: a resistor having a resistance, and a conductor having a second impedance, wherein the combination of the resistance and the second impedance is based on the first impedance.

16 Claims, 7 Drawing Sheets

LOSS-CONTROLLED COMPUTING CABLE

BACKGROUND

Field of the Disclosure

The disclosure relates generally to computing cables.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a computing cable that connects computing elements, including: a trace including a first trace segment and a second trace segment, the trace having a first impedance; and an attenuator connecting the first trace segment to the second trace segment, the attenuator including: a resistor having a resistance, and a conductor having a second impedance, wherein the combination of the resistance and the second impedance is based on the first impedance.

Other embodiments of these aspects include corresponding systems and apparatus.

These and other embodiments may each optionally include one or more of the following features. For instance, the combination of the resistance and the second impedance is equal to the first impedance. The resistor and the conductor are connected in parallel. The conductor is a loop. A length of the loop of the conductor is based on a wavelength of a signal transmitted by the computing cable. The length of the conductor is one-quarter of the wavelength of the signal. The signal is a single-ended signal. The computing cable connects two printed circuit boards within an information handling system. The computing cable connects two information handling systems.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
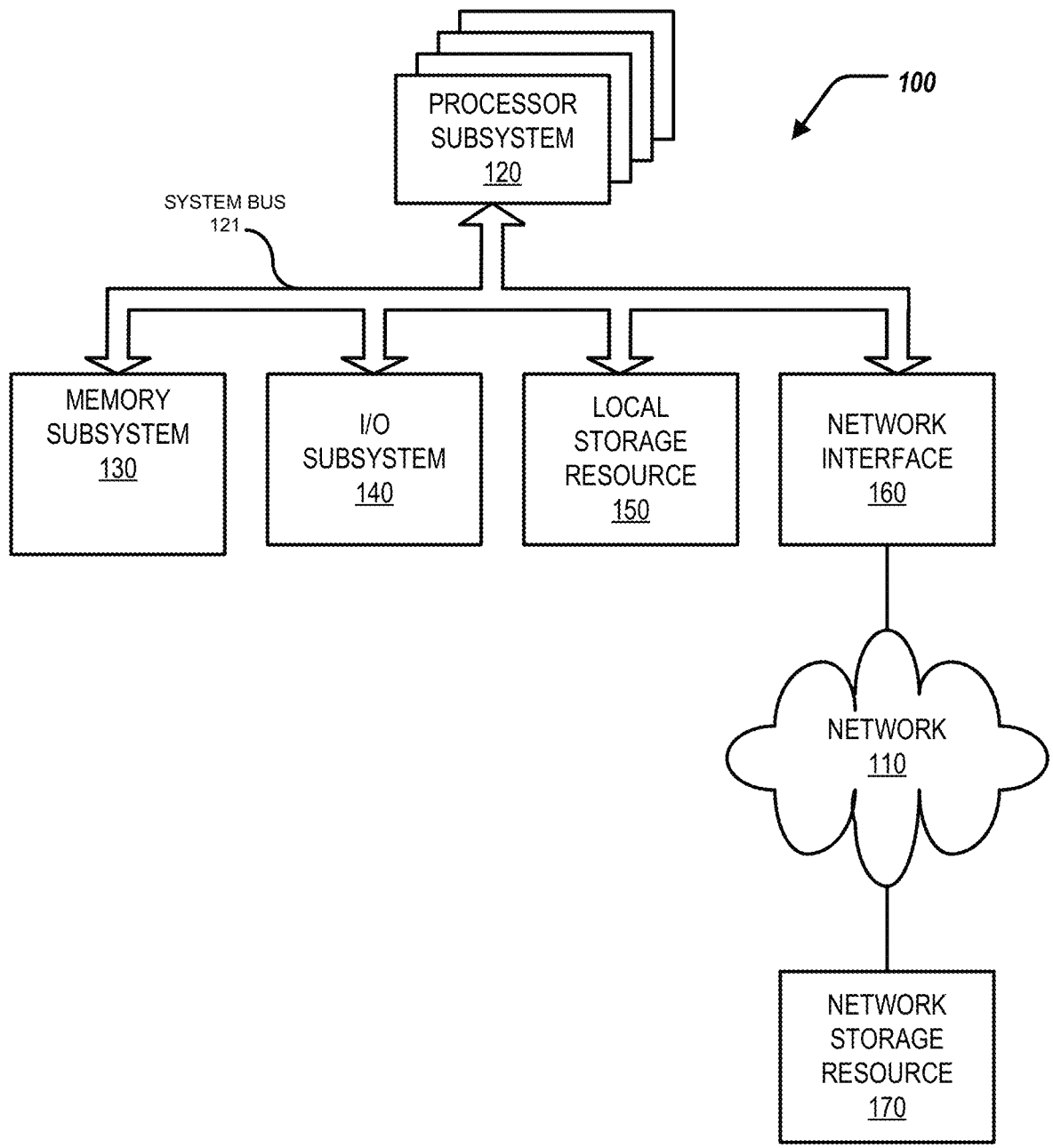
FIG. 1 is a block diagram of selected elements of an embodiment of an information handling system.

This disclosure discusses a computing cable. In short, the computing cable can connect together printed circuit boards (PCBs) within an information handling system, or connect together separate information handling systems. The computing cable include resistive loss such that uniform loss can be provided independent of a cable length of the computing cable.

Specifically, this disclosure discusses a computing cable that connects computing elements, including: a trace including a first trace segment and a second trace segment, the trace having a first impedance; an attenuator connecting the first trace segment to the second trace segment, the attenuator including: a resistor having a resistance, and a conductor having a second impedance, wherein the combination of the resistance and the second impedance is based on the first impedance.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
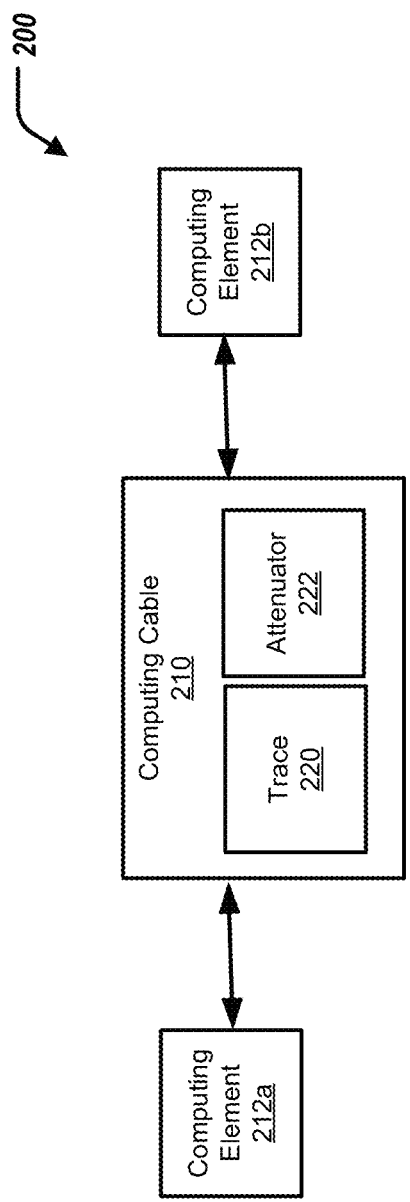
FIG. 2 illustrates a block diagram of a computing environment, including a computing cable in a first implementation.

Turning to FIG. 2, FIG. 2 illustrates an environment 200 including a computing cable 210 (or wire 210), a first computing element 212a, and a second computing element 212b. The first computing element 212a and the second computing element 212b can be referred to as computing elements 212. The computing cable 210 can include a trace 220 and an attenuator 222; however, the computing cable 210 can include any number of traces and attenuators.

In some examples, the computing elements 212 are information handling systems, and can be similar to, or includes, the information handling system 100 of FIG. 1. In some examples, the computing elements 212 are printed circuit boards (PCBs) of an information handling system (e.g., the information handling system 100).

The computing cable 210 can connect the first computing element 212a to the second computing element 212b. When the computing elements 212 include information handling systems, the computing cable 210 connects the two information handling systems. When the computing elements 212 include PCBs, the computing cable 210 connects the PCBs.

Figure 3A:
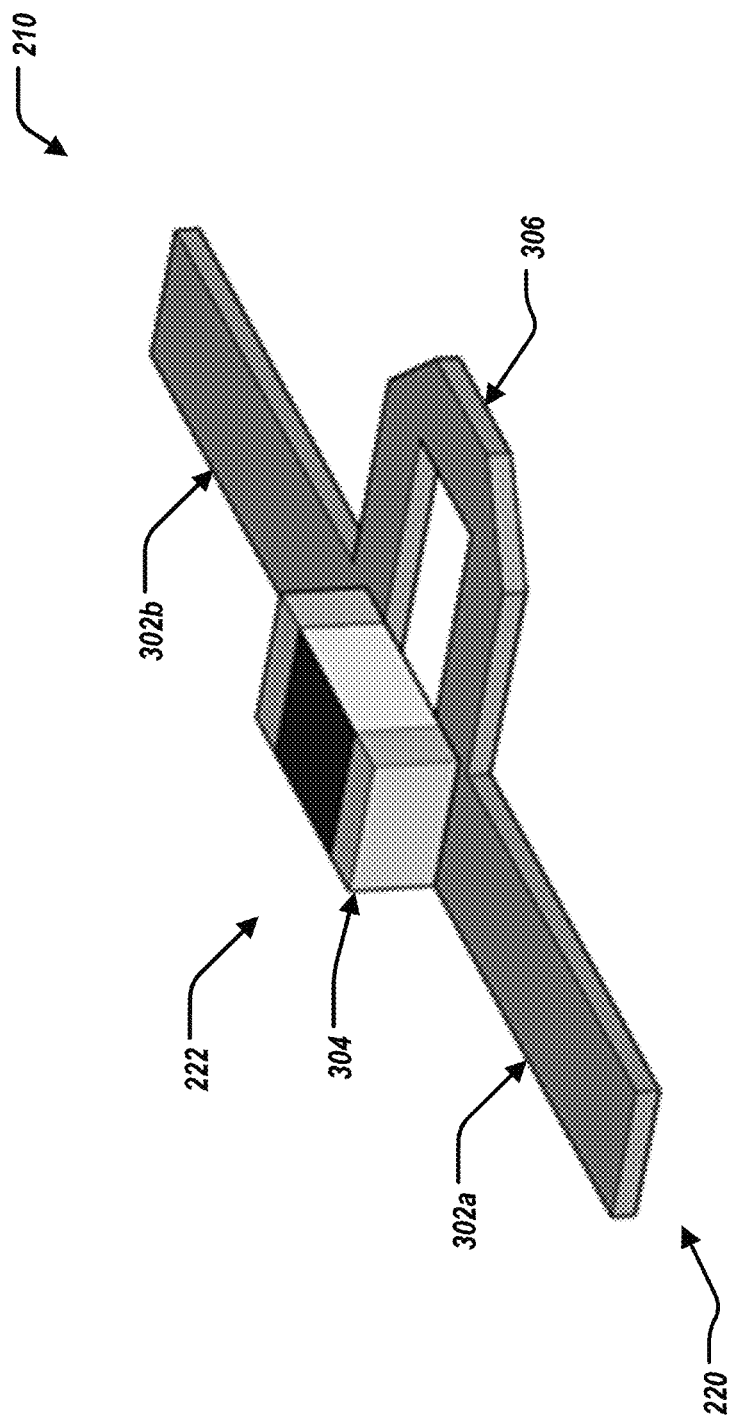
FIG. 3A illustrates a top down perspective view of the computing cable, in the first implementation.
Figure 3B:
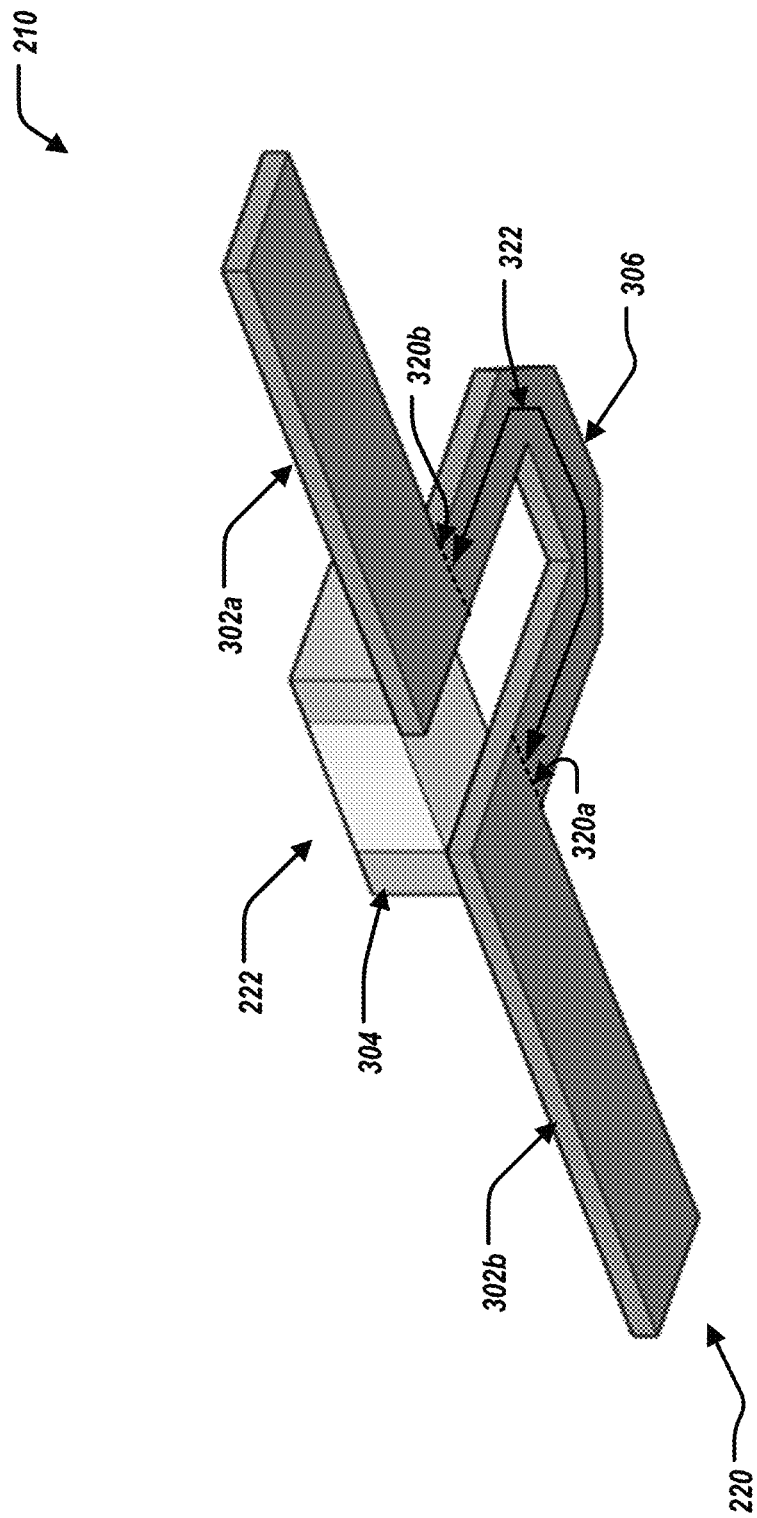
FIG. 3B illustrates a bottom up perspective view of the computing cable, in the first implementation.

FIG. 3A illustrates a top down perspective view of the computing cable 210; and FIG. 3B illustrates a bottom up perspective view of the computing cable 210. The cable 210 (or wire 210) can include the trace 220. The trace 220 can include a first trace segment 302a and a second trace segment 302b (collectively referred to as trace segments 302). The trace 220 can be associated with a first impedance $Z_1$. That is, the first trace segment 302a can be associated with the first impedance $Z_1$; and the second trace segment 302b can be associated with the first impedance $Z_1$.

The attenuator 222 connects the first trace segment 302a to the second trace segment 302b. The attenuator 222 includes a resistor 304 and a conductor 306. The resistor 304 can be associated with a first resistance $R_1$, and the conductor 306 can be associated with a second impedance $Z_2$. In some examples, the value of the first resistance $R_1$ is chosen based on a desired loss of the computing cable 210. A lower value of the first resistance $R_1$ results in increase in the loss of the computing cable 210.

The resistor 304 and the conductor 306 are connected in parallel along the trace 220. Furthermore, the conductor 306 is a loop having a length. For example, the length of the loop of the conductor 306 is defined as the total distance added by the loop between the first trace segment 302a and the second trace segment 302b. For example, the length of the loop of the conductor 306 can be defined between the points 320a and 320b around the loop. For example, the length of the loop of the conductor 306 can be defined by the distance 322.

In some examples, the length of the loop of the conductor 306 is based on a wavelength of a signal transmitted by the computing cable 210. That is, the length of the loop of the conductor 306 is based on a wavelength of a signal transmitted along the signal trace segments 302. In some examples, the length of the loop of the conductor 306 is one-quarter of the wavelength of the signal. For example, when the wavelength of the signal is 16 GHz, the length of the loop of the conductor 306 is 3 millimeters.

To that end, the combination of the first resistance $R_1$ and the second impedance $Z_2$ is based on the first impedance $Z_1$. That is, the combination of the first resistance $R_1$ of the resistor 304 and the second impedance $Z_2$ of the conductor 306 is based on the first impedance $Z_1$ of the first trace segment 302a or the second trace segment 302b. That is, the first resistance $R_1$ of the resistor 304 and the second impedance $Z_2$ of the conductor 306 should "match" the first impedance $Z_1$ of the first trace segment 302a or the second trace segment 302b.

In some examples, the first resistance $R_1$ and the second impedance $Z_2$ equal the first impedance $Z_1$. That is, as the resistor 304 and the conductor 306 are connected in parallel, the length of the loop of the conductor 306 and the values of the first resistance $R_1$ of the first resistor 304 and the second impedance $Z_2$ of the conductor 306 are chosen such that $Z_1 = R_1 \| Z_2$.

In some examples, the signal that is transmitted by the computing cable 210 is a single-ended signal. For example, the signal that is transmitted by the computing cable 210 is a DDR signal.

Figure 4:
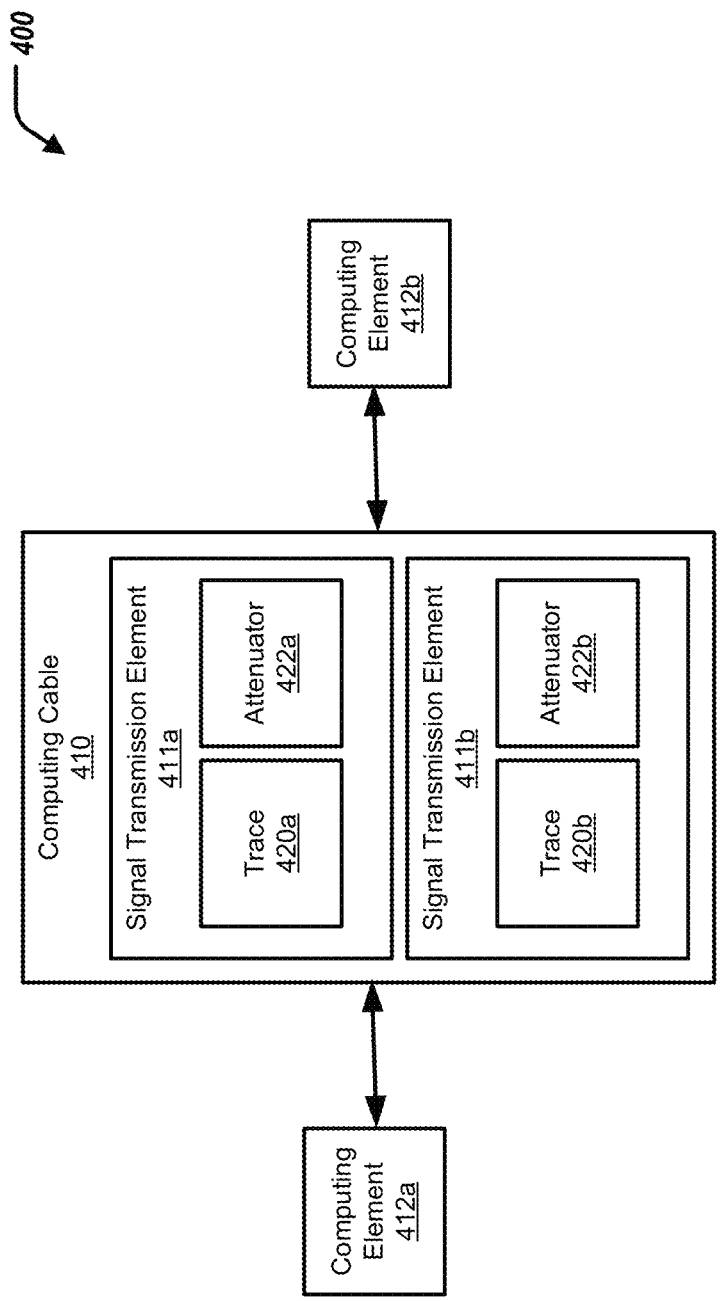
FIG. 4 illustrates a block diagram of a computing environment, including the computing cable in a second implementation.

Turning to FIG. 4, FIG. 4 illustrates an environment 400 including a computing cable 410 (or wire 410), a first computing element 412a, and a second computing element 412b. The first computing element 412a and the second computing element 412b can be referred to as computing elements 412.

The computing cable 410 can include a first signal transmission element 411a and a second signal transmission element 411b. The first signal transmission element 411a and the second signal transmission element 411b can collectively be referred to as signal transmission elements 411.

The first signal transmission element 411a can include a first trace 420a and a first attenuator 422a; however, the computing cable 410 can include any number of traces and attenuators. The second signal transmission element 411b can include a second trace 420b and a second attenuator 422b; however, the computing cable 410 can include any number of traces and attenuators.

In some examples, the computing elements 412 are information handling systems, and can be similar to, or includes, the information handling system 100 of FIG. 1. In some examples, the computing elements 412 re a printed circuit boards (PCBs) of an information handling system (e.g., the information handling system 100).

The computing cable 410 can connect the first computing element 412a to the second computing element 412b. When the computing elements 412 include information handling systems, the computing cable 410 connects the two information handling systems. When the computing elements 412 include PCBs, the computing cable 410 connects the PCBs.

Figure 5:
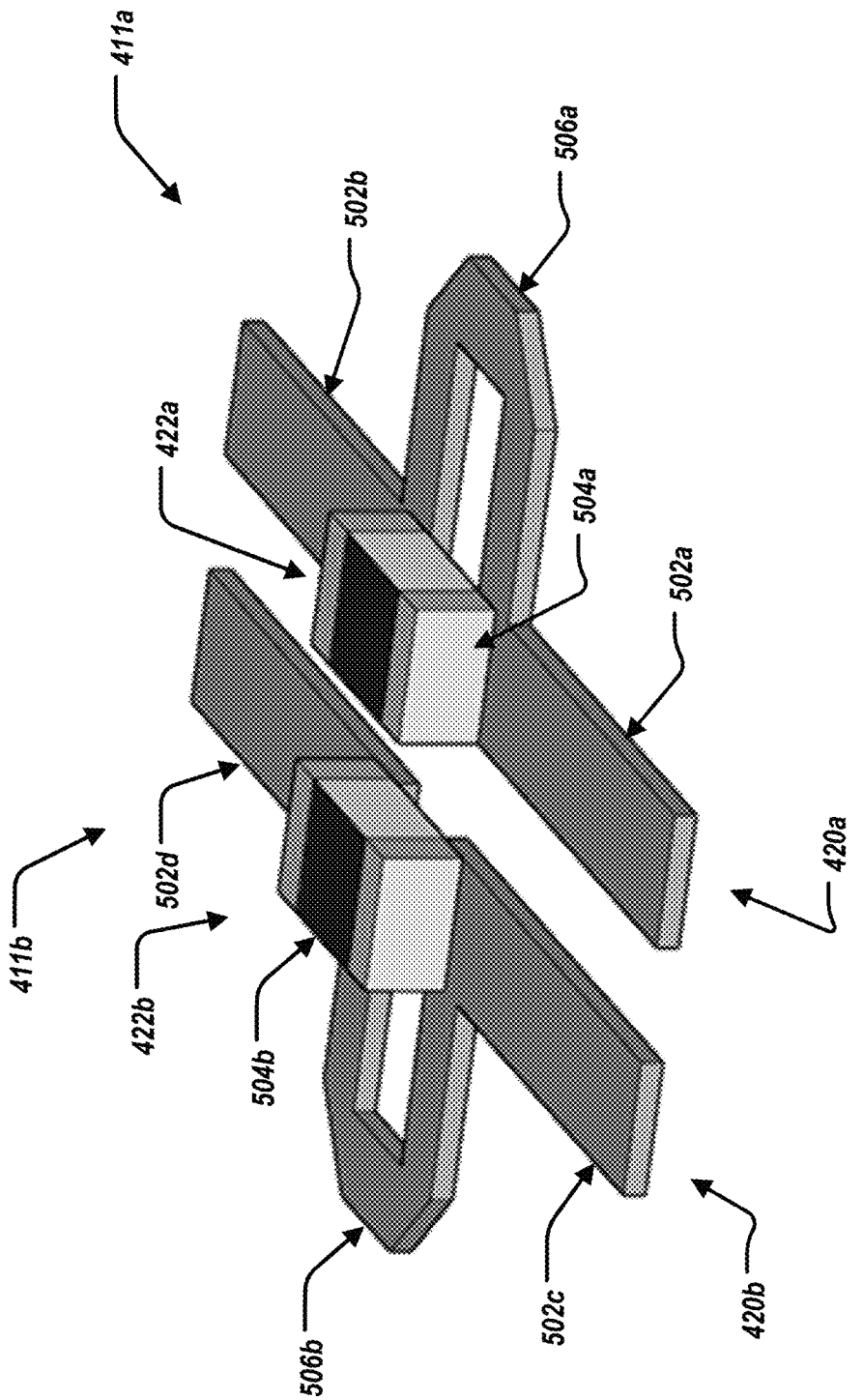
FIG. 5 illustrates a top down perspective view of the computing cable, in the second implementation.

FIG. 5 illustrates a top down perspective view of the computing cable 410. The cable 410 (or wire 410) can include the first signal transmission element 411a and the second signal transmission element 411b.

With respect to the first signal transmission element 411a, the first trace 420a of the first signal transmission element 411a can include a first trace segment 502a and a second trace segment 502b. The first trace 420a can be associated with the first impedance $Z_1$. That is, the first trace segment 502a can be associated with the first impedance $Z_1$; and the second trace segment 502b can be associated with the first impedance $Z_1$.

The first attenuator 422a connects the first trace segment 502a to the second trace segment 502b. The first attenuator 422a includes a first resistor 504a and a first conductor 506a. The first resistor 504a can be associated with the first resistance $R_1$, and the first conductor 506a can be associated with the second impedance $Z_2$. In some examples, the value of the first resistance $R_1$ is chosen based on a desired loss of the computing cable 410. A lower value of the first resistance $R_1$ results in increase in the loss of the computing cable 410.

The first resistor 504a and the first conductor 506a are connected in parallel along the trace 420a. Furthermore, the first conductor 506a is a loop having a length. For example, the length of the loop of the first conductor 506a is defined as the total distance added by the loop between the first trace segment 502a and the second trace segment 502b. For example, the length of the loop of the first conductor 506a can be defined similar to that with respect to the conductor 306 (e.g., between the points 320a and 320b around the loop; by the distance 322).

In some examples, the length of the loop of the first conductor 506a is based on a wavelength of a signal transmitted by the computing cable 410. That is, the length of the loop of the first conductor 506a is based on a wavelength of a signal transmitted along the signal trace segments 502a and 502b. In some examples, the length of the loop of the first conductor 506a is one-quarter of the wavelength of the signal. For example, when the wavelength of the signal is 16 GHz, the length of the loop of the first conductor 506a is 3 millimeters.

To that end, the combination of the first resistance $R_1$ and the second impedance $Z_2$ is based on the first impedance $Z_1$. That is, the combination of the first resistance $R_1$ of the first resistor 504a and the second impedance $Z_2$ of the first conductor 506a is based on the first impedance $Z_1$ of the first trace segment 502a or the second trace segment 502b. That is, the first resistance $R_1$ of the first resistor 504a and the second impedance $Z_2$ of the first conductor 506a should "match" the first impedance $Z_1$ of the first trace segment 502a or the second trace segment 502b.

In some examples, the first resistance $R_1$ and the second impedance $Z_2$ equals the first impedance $Z_1$. That is, as the first resistor 504a and the first conductor 506a are connected in parallel, the length of the loop of the first conductor 506a and the values of the first resistance $R_1$ of the first resistor 504a and the second impedance $Z_2$ of the first conductor 506a are chosen such that $Z_1=R_1\|Z_2$.

With respect to the second signal transmission element 411b, the second trace 420b of the second signal transmission element 411b can include a third trace segment 502c and a fourth trace segment 502d. The second trace 420b can be associated with a third impedance $Z_3$. That is, the third trace segment 502c can be associated with the third impedance $Z_3$; and the fourth trace segment 502d can be associated with the third impedance $Z_3$.

The second attenuator 422b connects the third trace segment 502c to the fourth trace segment 502d. The second attenuator 422b includes a second resistor 504b and a second conductor 506b. The second resistor 504b can be associated with a second resistance $R_2$, and the second conductor 506b can be associated with a fourth impedance $Z_4$. In some examples, the value of the second resistance $R_2$ is chosen based on a desired loss of the computing cable 410. A lower value of the second resistance $R_2$ results in increase in the loss of the computing cable 410.

The second resistor 504b and the second conductor 506b are connected in parallel along the trace 420b. Furthermore, the second conductor 506b is a loop having a length. For example, the length of the loop of the second conductor 506b is defined as the total distance added by the loop between the third trace segment 502c and the fourth trace segment 502d. For example, the length of the loop of the second conductor 506b can be defined similar to that with respect to the conductor 306 (e.g., between the points 320a and 320b around the loop; by the distance 322).

In some examples, the length of the loop of the second conductor 506b is based on a wavelength of a signal transmitted by the computing cable 410. That is, the length of the loop of the second conductor 506b is based on a wavelength of a signal transmitted along the signal trace segments 502c and 502d. In some examples, the length of the loop of the second conductor 506b is one-quarter of the wavelength of the signal. For example, when the wavelength of the signal is 16 GHz, the length of the loop of the second conductor 506b is 3 millimeters.

To that end, the combination of the second resistance $R_2$ and the fourth impedance $Z_4$ is based on the third impedance $Z_3$. That is, the combination of the second resistance $R_2$ of the second resistor 504b and the fourth impedance $Z_4$ of the second conductor 506b is based on the third impedance $Z_3$ of the third trace segment 502c or the fourth trace segment 502d. That is, the second resistance $R_2$ of the second resistor 504b and the fourth impedance $Z_4$ of the second conductor 506b should "match" the third impedance $Z_3$ of the third trace segment 502c or the fourth trace segment 502d.

In some examples, the second resistance $R_2$ and the fourth impedance $Z_4$ equals the third impedance $Z_3$. That is, as the second resistor 504b and the second conductor 506b are connected in parallel, the length of the loop of the second conductor 506b and the values of the second resistance $R_2$ of the second resistor 504b and the fourth impedance $Z_4$ of the second conductor 506b are chosen such that $Z_3=R_2\|Z_4$.

In some examples, the signal that is transmitted by the computing cable 410 is a differential signal. For example, the signal that is transmitted by the computing cable 410 is a PCIe signal.

Figure 6:
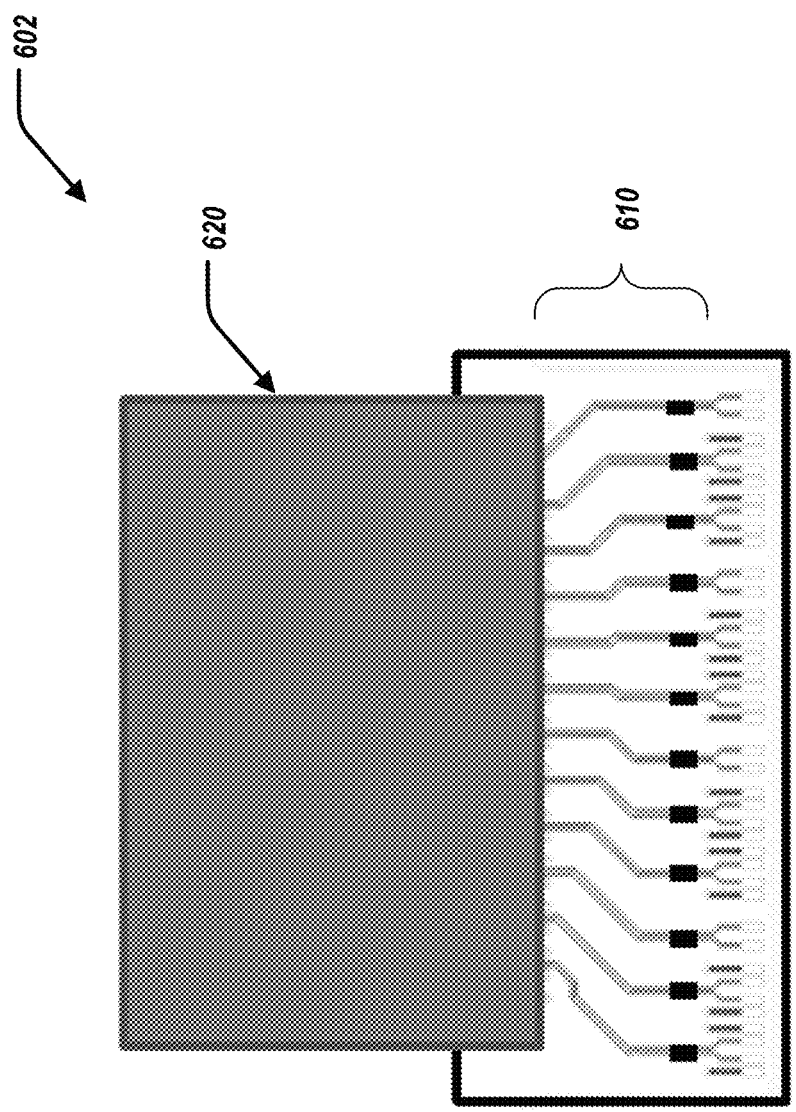
FIG. 6 illustrates a paddle board layout.

FIG. 6 illustrates a paddle board layout 602 (high-level layout of a paddle board-based implementation). For example, the paddle board 602 can include multiple computing cables 610, which can be the computing cable 210 and/or the computing cable 410. The paddle board 602 can include a ribbon cable 620.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computing cable that connects computing elements, including:
   a trace including a first trace segment and a second trace segment, the trace having a first impedance; and
   an attenuator connecting the first trace segment to the second trace segment, the attenuator including:
      a resistor having a resistance, and
      a conductor having a second impedance,
   wherein the combination of the resistance and the second impedance is equal to the first impedance.

2. The computing cable of claim 1, wherein the resistor and the conductor are connected in parallel.

3. The computing cable of claim 1, wherein the conductor is a loop.

4. The computing cable of claim 3, wherein a length of the loop of the conductor is based on a wavelength of a signal transmitted by the computing cable.

5. The computing cable of claim 4, wherein the length of the conductor is one-quarter of the wavelength of the signal.

6. The computing cable of claim 4, wherein the signal is a single-ended signal.

7. The computing cable of claim 1, wherein the computing cable connects two printed circuit boards within an information handling system.

8. The computing cable of claim 1, wherein the computing cable connects two information handling systems.

9. A computing cable that connects computing elements, including:
   a first signal transmission element, including:
      a first trace including a first trace segment and a second trace segment, the first trace having a first impedance; and
      a first attenuator connecting the first trace segment to the second trace segment, the first attenuator including:
         a first resistor having a first resistance, and
         a first conductor having a second impedance,
   a second signal transmission element, including:
      a second trace including a third trace segment and a fourth trace segment, the second trace having a third impedance; and
      a second attenuator connecting the third trace segment to the fourth trace segment, the second attenuator including:
         a second resistor having a second resistance, and
         a second conductor having a fourth impedance,
      wherein the combination of the first resistance and the second impedance is equal to the first impedance,
      wherein the combination of the second resistance and the fourth impedance is equal to the third impedance.

10. The computing cable of claim 9, wherein the first resistor and the first conductor are connected in parallel, and wherein the second resistor and the second conductor are connected in parallel.

11. The computing cable of claim 9, wherein the first conductor is a first loop, and the second conductor is a second loop.

12. The computing cable of claim 11, wherein the length of the first loop of the first conductor and the second loop of the second conductor is based on a wavelength of a signal transmitted by the computing cable.

13. The computing cable of claim 12, wherein the length of the first loop of the first conductor and the second loop of the second conductor is one-quarter of the wavelength of the signal.

14. The computing cable of claim 12, wherein the signal is a differential signal.

15. The computing cable of claim 9, wherein the computing cable connects two printed circuit boards within an information handling system.

16. The computing cable of claim 9, wherein the computing cable connects two information handling systems.

* * * * *